(12) United States Patent
Kim et al.

(10) Patent No.: US 8,576,676 B2
(45) Date of Patent: Nov. 5, 2013

(54) FLEXIBLE CABLE FOR OPTICAL PICKUP AND OPTICAL DISC DRIVE INCLUDING THE SAME

(75) Inventors: Young-bin Kim, Hwaseong-si (KR); Young-sun Jung, Suwon-si (KR)

(73) Assignee: Toshiba Samsung Storage Technology Korea Corporation, Suwon-si (KR)

( * ) Notice: Subject to any disclaimer, the term of this patent is extended or adjusted under 35 U.S.C. 154(b) by 0 days.

(21) Appl. No.: 13/372,204

(22) Filed: Feb. 13, 2012

(65) Prior Publication Data

US 2013/0028065 A1  Jan. 31, 2013

(30) Foreign Application Priority Data

Jul. 29, 2011  (KR) .......................... 10-2011-0076141

(51) Int. Cl.
*G11B 7/00* (2006.01)

(52) U.S. Cl.
USPC ..................................... 369/44.14; 360/264.2

(58) Field of Classification Search
USPC ............ 474/110, 101; 361/58, 749, 777, 759, 361/803; 439/540.1, 497, 495, 267, 874, 439/164, 67, 492; 369/44.12, 44.14, 44.15, 369/44.21; 360/261, 261.1, 261.2, 264.2; 385/101, 102, 113, 100; 348/208.4, 348/373; 396/542
See application file for complete search history.

(56) References Cited

U.S. PATENT DOCUMENTS

| | | | |
|---|---|---|---|
| 6,194,664 B1 * | 2/2001 | Zamora et al. | 174/117 F |
| 6,320,835 B1 * | 11/2001 | Kamei | 720/653 |
| 7,511,962 B2 * | 3/2009 | Hou et al. | 361/749 |
| 7,586,519 B2 * | 9/2009 | Nomura et al. | 348/208.4 |
| 7,734,083 B2 * | 6/2010 | Teramoto et al. | 382/147 |
| 7,774,804 B2 | 8/2010 | Onuma et al. | |
| 2003/0235012 A1 * | 12/2003 | Nishizawa | 360/264.2 |
| 2004/0173374 A1 * | 9/2004 | Chen et al. | 174/117 FF |
| 2009/0044206 A1 * | 2/2009 | Onuma et al. | 720/601 |
| 2010/0306790 A1 * | 12/2010 | Yeh et al. | 720/600 |

FOREIGN PATENT DOCUMENTS

| | | |
|---|---|---|
| JP | 07-036374 A | 2/1995 |
| KR | 10-0694261 B1 | 3/2007 |
| KR | 10-2009-0062078 A | 6/2009 |

OTHER PUBLICATIONS

Korean Office Action mailed Oct. 12, 2012, issued in counterpart Korean Patent Application No. 10-2011-0076141; 3 pages in Korean language.

* cited by examiner

*Primary Examiner* — Nabil Hindi
(74) *Attorney, Agent, or Firm* — NSIP Law

(57) ABSTRACT

A flexible cable is provided. The flexible cable includes a base film having a band shape, a plurality of wiring layers disposed on the base film and extending in one direction, and a plurality of elasticity-adjusting patterns attached to a portion of the base film and partially adjusting the elasticity of the flexible cable.

22 Claims, 4 Drawing Sheets

FLEXIBLE CABLE FOR OPTICAL PICKUP AND OPTICAL DISC DRIVE INCLUDING THE SAME

CROSS-REFERENCE TO RELATED PATENT APPLICATION(S)

This application claims the benefit of Korean Patent Application No. 10-2011-0076141, filed on Jul. 29, 2011, in the Korean Intellectual Property Office, the entire disclosure of which is incorporated herein by reference for all purposes.

BACKGROUND

1. Field of the Invention

The following description relates to a flexible cable for an optical pickup and an optical disc drive including the same.

2. Description of the Related Art

Optical pickups may be move in a radial direction across a track of an optical disc in response to the optical pickups facing a recording surface of the optical disc. Such optical pickups may be connected via a flat flexible cable (FFC). The FFC exchanges a control signal and a radio frequency (RF) signal with a circuit board. The FFC is connected between an optical pickup and a circuit board and an optical pickup. The optical pickup moves along a feeding rail or shaft. The circuit board may be fixed. Thus, the FFC is properly bent so as to not disturb the movement of the optical pickup. Stress may concentrate on a bent portion of the FFC in response to the optical pickup moving along the feeding rail or shaft. In order to disperse such stress, the FFC may have a uniform curvature. As another aspect, the curvature of the FFC may be irregular resulting in short circuits in the bent portion. To minimize the occurrence of short circuits, a reinforcing sheet for reinforcing the elasticity of the structure may be attached to a bent portion of the structure. The structure including the reinforcing sheet aids in the dispersion of stress in the bent portion of the FFC. However, the thickness of the reinforcing sheet is limited to a particular range. This is because physical characteristics of the reinforcing sheet are considered for generation of a proper elastic force. In response to selecting the reinforcing sheet, the reinforcing sheet's thickness and material may need to be more freely determined and selected.

SUMMARY

According to an aspect, a flexible cable is provided. The flexible cable includes a base film having a band shape, a plurality of wiring layers disposed on the base film and extending in one direction, and a plurality of elasticity-adjusting patterns attached to a portion of the base film and partially adjusting the elasticity of the flexible cable.

The elasticity-adjusting patterns may include a plurality of through holes formed through a reinforcing film attached to the base film.

The plurality of through holes may have at least two different sizes.

The elasticity-adjusting patterns may include a plurality of dimples (concavities) formed on a reinforcing film attached to the base film.

The plurality of dimples may have at least two different sizes.

The elasticity-adjusting patterns may include a plurality of through holes formed through a reinforcing film attached to the base film and a plurality of dimples formed on the reinforcing film.

The plurality of through holes and dimples may have at least two different sizes.

A size of a margin between an edge of the outermost wiring layer among the plurality of wiring layers and an edge of the base film may be greater than a size of a pitch between the plurality of wiring layers.

The size of the margin may be twice the size of the pitch.

The plurality of elasticity-adjusting patterns may be located on a reinforcing film attached to the base film.

Each elasticity-adjusting pattern may have a polygonal, oval, star or honeycomb shape.

In another aspect, an optical disc drive is provided. The optical disc drive includes a pickup unit including an optical pickup configured to access a recording surface of an optical disc, a transfer mechanism configured to drive the pickup unit, a circuit board connected to the optical pickup, a main frame supporting the transfer mechanism, and a flexible cable connecting the pickup unit and the circuit board and includes a base film having a band shape, a plurality of wiring layers disposed on the base film and extending in one direction, and a plurality of elasticity-adjusting patterns attached to a portion of the base film and partially adjusting the elasticity of the flexible cable.

The elasticity-adjusting patterns may include a plurality of through holes formed through a reinforcing film attached to the base film.

The plurality of through holes may have at least two different sizes.

The elasticity-adjusting patterns may include a plurality of dimples (concavities) formed on a reinforcing film attached to the base film.

The plurality of dimples may have at least two different sizes.

The elasticity-adjusting patterns may include a plurality of through holes formed through a reinforcing film attached to the base film and a plurality of dimples formed on the reinforcing film.

The plurality of through holes and dimples may have at least two different sizes.

A size of a margin between an edge of the outermost wiring layer among the plurality of wiring layers and an edge of the base film may be greater than a size of a pitch between the plurality of wiring layers.

The size of the margin may be twice the size of the pitch.

In another aspect, a device is provided. The device includes a flexible cable including a plurality of wiring layers extending in one direction disposed on a base film, and a plurality of elasticity-adjusting patterns attached to a portion of the base film.

Other features and aspects may be apparent from the following detailed description, the drawings, and the claims.

Figure 1:
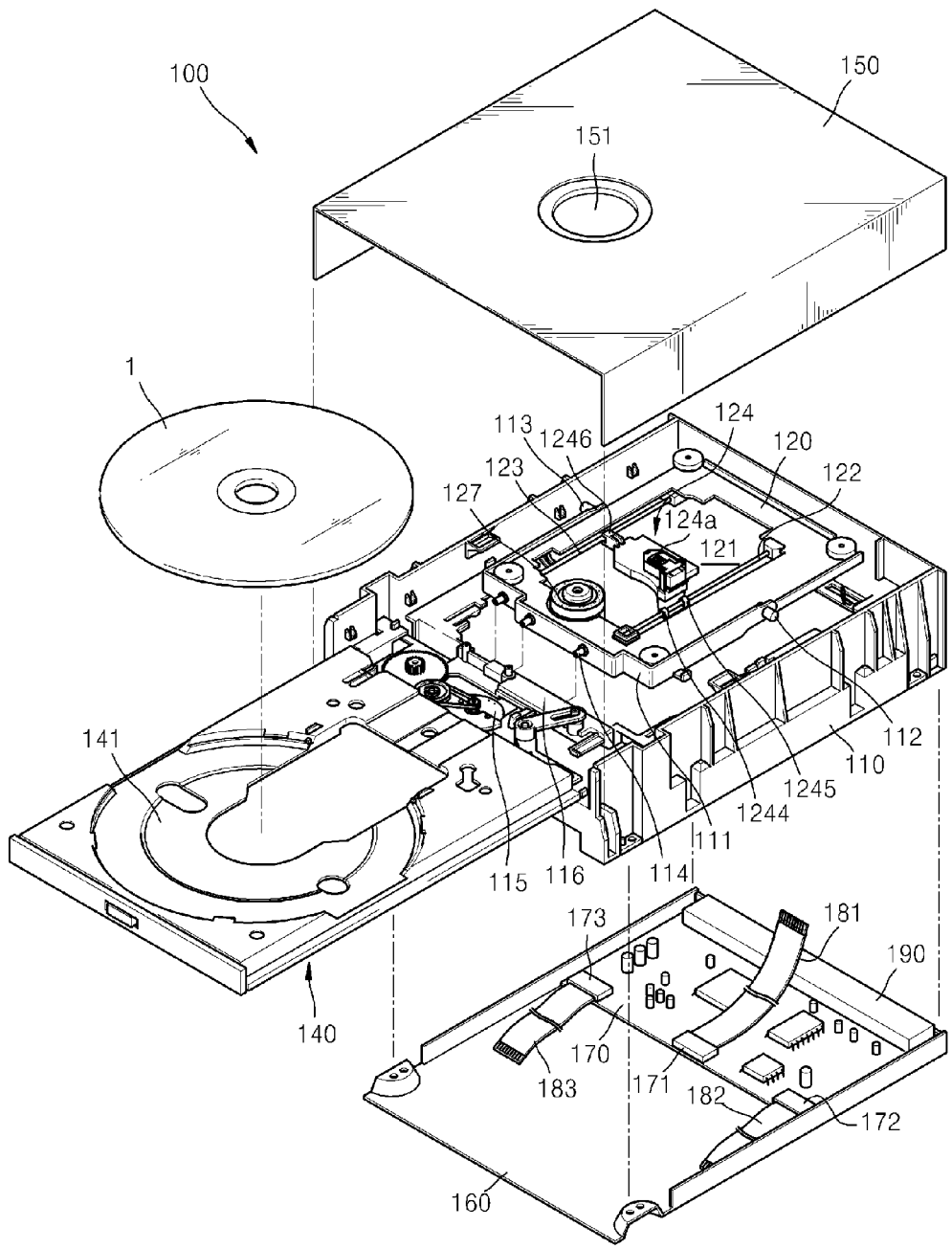
FIG. 1 is a view illustrating an example of an optical disc drive including flexible cables.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

FIG. 1 illustrates an example of an optical disc drive 100 including flexible cables.

Referring to FIG. 1, the optical disc drive 100 includes a main frame 110 and a tray 140 that enters the main frame 110. The tray 140 includes a mounting portion 141 on which a disc 1 may be mounted. The main frame 110 includes a sub-frame 111 and a base chassis 120. The sub-frame 111 may be installed at an upper portion of the main frame 110 to be rotatable in a vertical direction. The base chassis 120 may be supported on the sub-frame 111.

The main frame 110 may further include a sliding member 116 that is operated by a driving motor 115 in a direction perpendicular to a direction in which the tray 140 enters the main frame 110. Thus, the tray 140 may be slidable. Since a plurality of cam holes (not shown) are formed in the sliding member 116 and a plurality of cam protrusions 114 formed on the sub-frame 111 slide along a track of the plurality of cam holes, the sub-frame 111 may be rotated in the vertical direction around rotation shafts 112 and 113. The rotation shafts 112 and 113 may be supported on the main frame 110. In this regard, the sub-frame 111 may move the base chassis 120 in the vertical direction so that a pickup unit 124 that is mounted on the base chassis 120 may be close to or spaced apart from a disc 1.

An opening 121 may be formed in the base chassis 120. A turntable 127 on which the disc 1 is mounted may be installed at one side of the opening 121, and the pickup unit 124 may be disposed inside the opening 121 and may make a reciprocating motion in a direction of a radius of the disc 1. Thus, the pickup unit 124 may access a recording surface of the disc 1. The pickup unit 124 may include an optical pickup 124*a*, as in a general pickup unit.

The pickup unit 124 includes a first guide shaft 122 and a second guide shaft 123. The first guide shaft 122 and the second guide shaft 123 may be part of a pickup unit transfer mechanism and may be disposed on both sides of the opening 121 to support the reciprocating motion of the pickup unit 124. The pickup unit 124 may include a transfer motor (not shown) on which a feeding screw is mounted, as in a general pickup unit. The feeding screw may be a main element of the pickup unit transfer mechanism.

Two bearing portions 1244 and 1245 may be disposed on one side of the pickup unit 124 and may be slidably combined with the first guide shaft 122. A bearing portion 1246 may be disposed at an opposite side to the side of the pickup unit 124 on which the bearing portions 1244 and 1245 are disposed, and the bearing portion 1246 may be slidably combined with the second guide shaft 123.

The upper portion of the main frame 110 may be covered by an upper cover 150. A rotation chuck 151 that corresponds to the turntable 127 may be disposed on the upper cover 150 and may chuck the disc 1 on the turntable 127. A lower cover 160 on which a circuit board 170 is mounted may be disposed on a lower portion of the main frame 110. The circuit board 170 includes an external socket 190 and internal sockets 171, 172, and 173. A plurality of cables for electrical communication with an external host device and a power supply for the external host device are connected to the external socket 190, as in the general pickup unit. The external host device may be a personal computer (PC). Flexible cables 181, 182, and 183 that are connected to the driving motor 115, the turntable 127, the pickup unit 124, and the aforementioned transfer mechanism, respectively, may be connected to the internal sockets 171, 172, and 173. The flexible cable 181 that is connected to the pickup unit 124 among the flexible cables 181, 182, and 183 may be continuously moved based on the movement of the pickup unit 124 in response to the flexible cable 181 being combined with the internal socket 171 of the circuit board 170.

Figure 2:
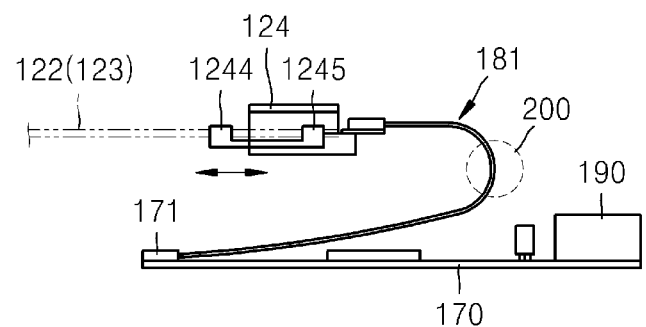
FIG. 2 is a view of an example illustrating the state of a flexible cable of the optical disc drive illustrated in FIG. 1 that connects a pickup unit and a circuit board to each other.

FIG. 2 illustrates an example of the interaction between the pickup unit 124, the flexible cable 181, and the internal socket 171.

The first and second guide shafts 122 and 123 may be disposed in a direction parallel to a plane of the circuit board 170. The pickup unit 124 may be mounted on the first and second guide shafts 122 and 123 and slide in one direction (a horizontal direction in FIG. 2). A socket for electrical connection with the circuit board 170 may be disposed on one side of the pickup unit 124. Both ends of the flexible cable 181 are combined with the socket for electrical connection and the internal socket 171 of the circuit board. The socket for electrical connection and the internal socket 171 of the circuit board may be disposed on the pickup unit 124 and the circuit board 170, respectively. Thus, a bent portion (dashed circle) is formed in the flexible cable 181 connected to the pickup unit 124. Stress caused by bending of the flexible cable 181 may be concentrated on the bent portion, and the bent portion may be moved along a lengthwise direction of the flexible cable 181 based on a position of the pickup unit 124. In order to disperse the stress in the bent portion, a curvature of the bent portion may need to uniformly vary. The bent portion may be unavoidably bent due to a structure of the flexible cable 181.

Figure 3:
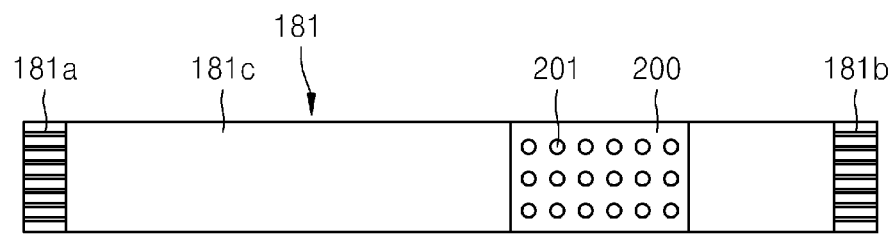
FIG. 3 is a view of an example illustrating a flexible cable.
Figure 4:
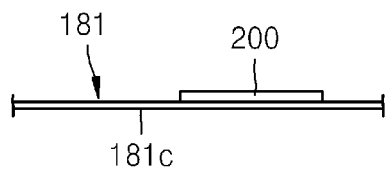
FIG. 4 is a partial cross-sectional view of an example illustrating the flexible cable illustrated in FIG. 3.

According to the present example, elasticity-adjusting patterns 201 for partially adjusting the elasticity (or elastic force) of the flexible cable 181 are formed on a reinforcing film 200. The reinforcing film 200 may be attached to the bent portion of the flexible cable 181 in order to reduce stress that concentrates on the bent portion, as illustrated in FIG. 3. As illustrated in FIG. 3, a plurality of wiring layers define terminal portions 181*a* and 181*b*. The terminal portions 181*a* and 181*b* are disposed on both ends of the flexible cable 181. The reinforcing film 200 is attached to a base film 181*c*. The base film 181*c* is located between the terminal portions 181*a* and 181*b*. FIG. 4 illustrates a partial cross-sectional view of the flexible cable 181 and an example of a state where the reinforcing film 200 is attached to one side of the base film 181c having a band or ribbon shape. A flexible cable includes a plurality of wiring layers disposed in parallel between two base films. Portions of the plurality of wiring layers may be exposed at both ends of the flexible cable.

Figure 5:
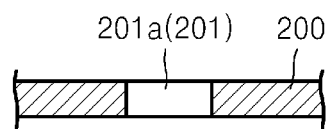
FIG. 5 is a view illustrating examples of through hole type elasticity-adjusting patterns formed on a reinforcing film of the flexible cable illustrated in FIG. 3.
Figure 6:
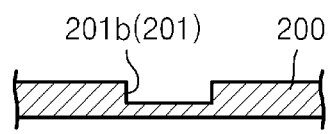
FIG. 6 is a view illustrating examples of dimple type (concavity type) elasticity-adjusting patterns formed on a reinforcing film of the flexible cable illustrated in FIG. 3.

FIGS. 5 and 6 illustrate examples of the elasticity-adjusting patterns. Referring to FIG. 5, elasticity-adjusting patterns 201a may have a shape of through holes formed through the reinforcing film 200. Referring to FIG. 6, elasticity-adjusting patterns 201b may have a shape of concavities or dimples partially formed in the reinforcing film 200. The elasticity-adjusting patterns 201a and 201b illustrated in FIGS. 5 and 6 may be selectively formed on the reinforcing film 200. According to another example, the elasticity-adjusting patterns 201a and 201b illustrated in FIGS. 5 and 6 may be formed in combination on the same reinforcing film 200.

Figure 7:
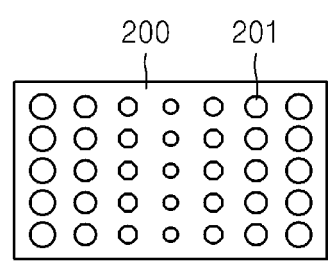
FIG. 7 is a view illustrating an example of a reinforcing film that is attached to the flexible cable illustrated in FIG. 3.

FIG. 7 illustrates an example of an arrangement of the elasticity-adjusting patterns 201a and 201b. Referring to FIG. 7, the sizes of the circular elasticity-adjusting patterns 201a and 201b may gradually changed from middle positions to outer positions. The elasticity-adjusting patterns 201a and 201b may partially adjust the elasticity of the flexible cable 181. However, according to another example, unlike the example illustrated in FIG. 7, the sizes of the elasticity-adjusting patterns 201a and 201b may change irregularly. In other words, according to the present example, a plurality of through holes and/or dimples of the elasticity-adjusting patterns 201a and 201b may have at least two different sizes.

Figure 8:
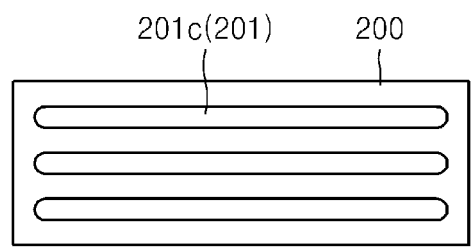
FIG. 8 is a view illustrating another example of a reinforcing film that is attached to the flexible cable illustrated in FIG. 3.
Figure 9:
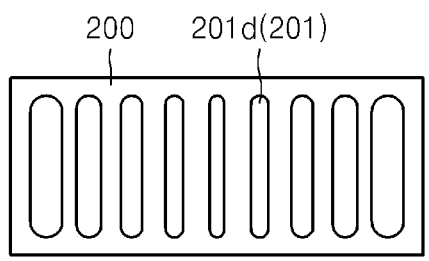
FIG. 9 is a view illustrating yet another example of a reinforcing film that is attached to the flexible cable illustrated in FIG. 3.

According to another example, the shape of the elasticity-adjusting patterns 201a and 201b may also be modified. FIGS. 8 and 9 illustrate examples of a reinforcing film that is attached to the flexible cable 181 illustrated in FIG. 3. Referring to FIGS. 8 and 9, elasticity-adjusting patterns 201c and 201d may have through holes or dimples that are shaped as long holes or slits. The long holes or slits may extend in one direction. As another aspect, the elastic-adjusting patterns 201c and 201d may have a polygonal, oval, star or honeycomb shape. According to another aspect, various elasticity-adjusting patterns 201c and 201d may be selected in combination and may be used in one reinforcing film.

As another aspect, using various shapes of patterns described above may partially adjust the elasticity of the reinforcing film according to the examples. Thus, the thickness or material of the reinforcing film is not limited because, even in a reinforcing film having very high elasticity, properly forming elasticity-adjusting patterns allows the elasticity of the reinforcing film to be reduced or the distribution of elasticity of the reinforcing film to be controlled.

Figure 10:
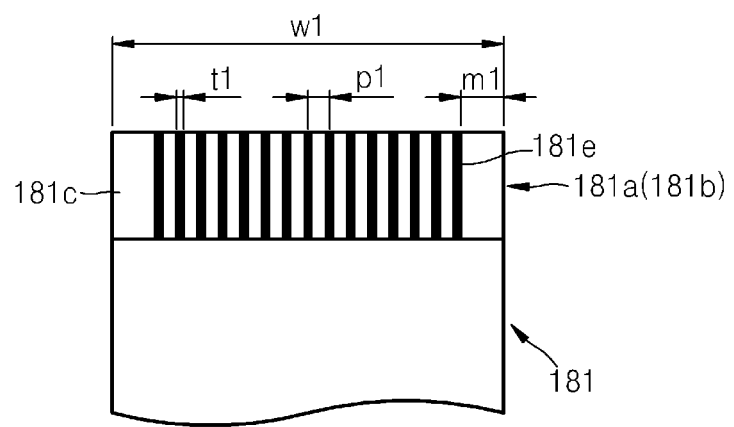
FIG. 10 is a view illustrating an example of a terminal portion of the flexible cable illustrated in FIG. 3.

FIG. 10 illustrates an example of the terminal portion 181a or 181b of the flexible cable 181 illustrated in FIG. 3. Referring to FIG. 10, a plurality of wiring layers 181e having a predetermined width t1 are disposed on the base film 181c having a predetermined width w1 at a predetermined pitch p1 between the plurality of wiring layers 181e. In this regard, an appropriate margin m1 from an edge of the base film 181c to an edge of the outermost wiring layer 181e among the plurality of wiring layers 181e may be maintained. Thus, the width t1 and the pitch p1 of the wiring layers 1813 and the margin m1 may determine the width w1 of the base film 181c. According to the current example, the margin m1 may be greater than the pitch p1. In a general flexible cable, a margin and a pitch thereof may be substantially the same. However, in the example of the structure of the flexible cable illustrated in FIG. 10, in which bending occurs repeatedly, in response to a margin being substantially similar to a pitch, efficiently suppressing coming off of wiring layers or separation of base films may be difficult. According to the present examples, the size of the margin may be greater than that of a general flexible cable so as to efficiently suppressing coming off of wiring layers or separation of base films. According to the present examples, the size of the margin may be twice the size of the pitch by considering the structure of a commonly-used socket.

The flexible cable described above may be a flat flexible cable (FFC) or a flexible printed circuit (FPC), preferably, a FFC. In addition, the flexible cable according to the present examples may be used in a slim optical disc drive for a laptop computer as well as a half/height optical disc drive. An FPC may be mainly used in the slim optical disc drive for a laptop computer. Thus, a reinforcing film FPC may also be used in a slim optical disc drive for a laptop computer, as described above.

According to the one or more examples described above, the concentration of stress on a bent portion of a flexible cable may be efficiently dispersed by operating an optical pickup that access a recording surface of an optical disc so that stress that may occur in wiring layers of the flexible cable may be reduced. Furthermore, differentiating stress dispersion may properly disperse stress so that distribution of stress on the bent portion of the flexible cable may be adjusted or controlled.

A blu-ray player, dvd player, optical disk drive, and the like may include a flexible cable.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A flexible cable comprising:
   a base film;
   a plurality of wiring layers disposed on the base film;
   a plurality of elasticity-adjusting patterns attached to a portion of the base film for adjusting the elasticity of the flexible cable; and
   a reinforcing film attached to the base film at a bendable portion,
   wherein the flexible cable is capable of bending throughout an entire length of the flexible cable.

2. The flexible cable of claim 1, wherein the elasticity-adjusting patterns comprise a plurality of through holes formed through the reinforcing film attached to the base film.

3. The flexible cable of claim 2, wherein the plurality of through holes have at least two different sizes.

4. The flexible cable of claim 1, wherein the elasticity-adjusting patterns comprise a plurality of dimples (concavities) formed on the reinforcing film attached to the base film.

5. The flexible cable of claim 4, wherein the plurality of dimples have at least two different sizes.

6. The flexible cable of claim 1, wherein the elasticity-adjusting patterns comprise a plurality of through holes formed through the reinforcing film attached to the base film and a plurality of dimples formed on the reinforcing film.

7. The flexible cable of claim 6, wherein the plurality of through holes and dimples have at least two different sizes.

8. The flexible cable of claim 1, wherein a size of a margin between an edge of the outermost wiring layer among the plurality of wiring layers and an edge of the base film is greater than a size of a pitch between the plurality of wiring layers.

9. The flexible cable of claim 8, wherein the size of the margin is twice the size of the pitch.

10. An optical disc drive comprising:
a pickup unit comprising an optical pickup configured to access a recording surface of an optical disc;
a transfer mechanism configured to drive the pickup unit;
a circuit board connected to the optical pickup;
a main frame supporting the transfer mechanism; and
a flexible cable connecting the pickup unit and the circuit board and comprising a base film, a plurality of wiring layers disposed on the base film, a plurality of elasticity-adjusting patterns attached to a portion of the base film for adjusting the elasticity of the flexible cable, and a reinforcing film attached to the base film at a bendable portion,
wherein the flexible cable is capable of bending throughout an entire length of the flexible cable.

11. The optical disc drive of claim 10, wherein the elasticity-adjusting patterns comprise a plurality of through holes formed through the reinforcing film attached to the base film.

12. The optical disc drive of claim 11, wherein the plurality of through holes have at least two different sizes.

13. The optical disc drive of claim 10, wherein the elasticity-adjusting patterns comprise a plurality of dimples (concavities) formed on the reinforcing film attached to the base film.

14. The optical disc drive of claim 13, wherein the plurality of dimples have at least two different sizes.

15. The optical disc drive of claim 10, wherein the elasticity-adjusting patterns comprise a plurality of through holes formed through the reinforcing film attached to the base film and a plurality of dimples formed on the reinforcing film.

16. The optical disc drive of claim 15, wherein the plurality of through holes and dimples have at least two different sizes.

17. The optical disc drive of claim 10, wherein a size of a margin between an edge of the outermost wiring layer among the plurality of wiring layers and an edge of the base film is greater than a size of a pitch between the plurality of wiring layers.

18. The optical disc drive of claim 17, wherein the size of the margin is twice the size of the pitch.

19. The flexible cable of claim 1, wherein the plurality of elasticity-adjusting patterns are located on the reinforcing film attached to the base film.

20. The flexible cable of claim 1, wherein each elasticity-adjusting pattern has a polygonal, oval, star or honeycomb shape.

21. A device comprising:
a flexible cable comprising:
a plurality of wiring layers disposed on a base film;
a plurality of elasticity-adjusting patterns attached to a portion of the base film; and
a reinforcing film attached to the base film at a bendable portion,
wherein the flexible cable is capable of bending throughout an entire length of the flexible cable.

22. The flexible cable of claim 1, wherein the elasticity-adjusting patterns gradually change in size from a middle position of the flexible cable to an outer position of the flexible cable.

* * * * *